(12) United States Patent
Ham

(10) Patent No.: US 11,500,050 B2
(45) Date of Patent: Nov. 15, 2022

(54) ENERGIZING AND DISCHARGING A SUPERCONDUCTING MAGNET OF AN MRI SYSTEM

(71) Applicant: KONINKLIJKE PHILIPS N.V., Eindhoven (NL)

(72) Inventor: Cornelis Leonardus Gerardus Ham, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/356,599

(22) Filed: Jun. 24, 2021

(65) Prior Publication Data
US 2021/0405139 A1    Dec. 30, 2021

(30) Foreign Application Priority Data

Jun. 25, 2020 (EP) .................................... 20182159

(51) Int. Cl.
*G01R 33/3815* (2006.01)
*G01R 33/385* (2006.01)
*H01F 6/02* (2006.01)

(52) U.S. Cl.
CPC ..... *G01R 33/3815* (2013.01); *G01R 33/3852* (2013.01); *H01F 6/02* (2013.01)

(58) Field of Classification Search
CPC ... G01R 33/3815; G01R 33/3852; H01F 6/02; H01F 6/008; H01F 6/06
See application file for complete search history.

(56) References Cited

U.S. PATENT DOCUMENTS

| | | | |
|---|---|---|---|
| 5,617,030 A | 4/1997 | Fischer et al. | |
| 6,147,844 A | 11/2000 | Huang et al. | |
| 10,739,426 B2 | 8/2020 | Ham et al. | |
| 2010/0267567 A1 | 11/2010 | Overweg et al. | |
| 2019/0122796 A1 | 4/2019 | Noyes et al. | |
| 2020/0057126 A1* | 2/2020 | Harvey | G01R 33/3815 |

FOREIGN PATENT DOCUMENTS

| | | |
|---|---|---|
| DE | 19527150 A1 | 1/1997 |
| JP | 2007117523 A | 5/2007 |

* cited by examiner

*Primary Examiner* — G.M. A Hyder

(57) ABSTRACT

A magnetic resonance imaging (MRI) system includes a superconducting magnet assembly with a superconducting field coil for generating a stationary uniform main magnetic field. A gradient system includes a gradient coil for generating gradient magnetic fields and a gradient amplifier which is connectable to the gradient coil for driving the gradient coil. A switch assembly is adapted for galvanically coupling the superconducting field coil to the gradient amplifier. In this way, it is possible for energizing and discharging a superconducting magnet of an MRI system in an easy and cost-efficient way.

15 Claims, 2 Drawing Sheets

ENERGIZING AND DISCHARGING A SUPERCONDUCTING MAGNET OF AN MRI SYSTEM

CROSS-REFERENCE TO RELATED APPLICATIONS

This application claims priority to EP 20182159.2 filed Jun. 25, 2020, which is incorporated herein by reference.

FIELD OF THE INVENTION

The invention relates to the field of magnetic resonance imaging (MRI) systems, and in particular to the field of energizing and discharging a superconducting magnet of a magnetic resonance imaging (MRI) system.

BACKGROUND OF THE INVENTION

Superconducting magnets of magnetic resonance imaging (MRI) systems need to be energized and discharged, respectively. Typically, the superconducting coil of the superconducting magnet of a typical MRI system is a closed loop and gets energized or discharged, respectively, by a magnet persistent mode switch (MPCS) which is made of the same material as the superconducting field coil. The MPCS is part of the same closed loop with the superconducting field coil. The MPCS becomes normal when it is warmed up above the critical temperature. When the temperature of the MPCS is under the critical temperature the magnet can run in persistent mode. When the temperature of the MPCS is above the critical temperature the wire is normal and has a reasonably high resistance. Because the superconducting coil has a huge self-inductance the current will decrease according to an exponential curve with a long time. The energize and discharge procedures cause dissipation in the magnet. Typically, a ramp voltage of 5 V and high currents of 480 A are used. For energizing the superconducting magnet this power needs to be delivered by a magnet power supply, and for discharging the superconducting magnet typically a set of diodes is used to create the discharge voltage. This power supply and discharge diodes might be delivered with the MRI system or might be provided as a service tool which, in both cases, means that the tools for the energize and discharge procedures means additional effort and costs.

SUMMARY OF THE INVENTION

Hence, it is an object of the invention to energize and discharge a superconducting magnet of an MRI system in an easy and cost-efficient way.

According to the invention, this object is addressed by the subject matter of the independent claims. Preferred embodiments of the invention are described in the sub claims.

Therefore, according to the invention, a MRI system is provided which comprises a superconducting magnet assembly with a superconducting field coil for generating a stationary uniform main magnetic field, a gradient system including a gradient coil for generating gradient magnetic fields and a gradient amplifier which is connectable to the gradient coil for driving the gradient coil, and a switch assembly which is adapted for galvanically coupling the superconducting field coil to the gradient coil.

If a gradient system is mentioned in the context of the present specification, one gradient axis of a MRI system with a gradient amplifier and at least one gradient coil for this axis (X-, Y- or Z-axis) is meant. If a plurality of gradient systems is mentioned, multiple different gradient axes are meant.

Further, in the context of the present specification, the term "galvanically coupling" with the aid of the switch assembly, e.g. "coupling the superconducting field coil to the gradient amplifier" means that the respective electrical DC connection, e.g. the connection from the superconducting field coil to the gradient amplifier, can be opened and closed, respectively, which means in the present example that the superconducting field coil can be coupled to and decoupled from the gradient amplifier, respectively.

According to a preferred embodiment of the invention, the switch assembly of the MRI system is adapted for galvanically coupling the superconducting field coil simultaneously to the gradient amplifier and to the gradient coil. The galvanically coupling of the superconducting field coil to the gradient amplifier provides for the possibility of energizing the superconducting field coil by the gradient amplifier. For discharging the superconducting field coil, the superconducting field coil is galvanically coupled with the gradient coil while the gradient amplifier may optionally stay connected, wherein the current through the gradient amplifier is zero. The MRI system of the invention further comprises a quench assembly to switch-off the superconducting field coil, and a switch controller configured to (i) control the switch assembly to galvanically couple the superconducting field coil to the gradient coil so as to discharge the superconducting field coil over the gradient coil to a threshold value of the electrical DC current strength and (ii) activate the quench assembly when the electrical DC current strength falls below the threshold value. This aspect of the invention has as an object to enable to down-ramp the superconducting magnet assembly even without electrical power being available to drive the gradient amplifier in reverse mode and/or actively cool the gradient coil, e.g. by fluid cooling through the gradient coil's hollow conductors or through separate cooling fluid conduits. This aspect of the invention enables the discharge the superconducting field coil resistively through the gradient coil(s) until the electrical current strength in the superconducting field coil is reduced to the pre-determined threshold value and then the superconductive field coil is further down-ramped via the quench assembly where the remaining liquid Helium is quickly evaporated and the field coil becomes resistive and the electrical current is reduced to zero. The quench assembly per se may be embodied as a conventional quench assembly as known for conventional superconducting magnets in which the superconducting field coil is placed in a liquid Helium bath. Because the discharge of the superconductive field coil is distributed over discharge over the gradient coil and then the remaining discharge is over the quench system. When the superconducting magnet is discharged to about 20% of its nominal electrical DC current strength (i.e. the current strength at the magnet's nominal field strength, typically 1.5 T, 3 T or 7 T) then the magnetic energy that remain in the superconducting field coil is reduced to 4% of the energy stored at nominal field and this may be carried-off though the quench system without the need for additional cool down.

When electrical power is available to drive the gradient amplifier, for the last amount of current, the gradient coil may be disconnected, so that the last amount of current runs through the gradient amplifier. The gradient amplifier delivers a negative voltage, so that it absorbs the remaining magnet energy.

In another disclosed aspect, the switch assembly of the MRI system is adapted for galvanically decoupling the superconducting field coil for a persistent mode of the superconducting field coil. During the regular operation of the MRI system when the superconducting field coil is energized, the superconducting field coil may be decoupled from the gradient amplifier and the gradient coil, so that the superconducting field coil can be operated in persistent mode by closing the MPCS.

According to a preferred embodiment of the invention, the switch assembly of the MRI system is adapted for galvanically coupling the superconducting field coil to the gradient amplifier alone, preferably for discharging the superconducting field coil. If the gradient amplifier is able to absorb all magnetic energy, the discharging may be performed without a gradient coil galvanically coupled.

One advantage resides in providing an MRI system, wherein the superconducting field coil, the gradient coil and the gradient amplifier each have a first connector and a second connector for galvanic connections to the superconducting field coil, the gradient coil and the gradient amplifier, respectively. The first connector of the gradient amplifier is connected to the first connector of the gradient coil via a first electrical line and the second connector of the gradient amplifier is connected to the second connector of the gradient coil via a second electrical line. The first connector of the superconducting field coil is connected to the first electrical line via a third electrical line and the second connector of the superconducting field coil is connected to the second electrical line via a fourth electrical line. The third electrical line comprises a first switch of the switch assembly for opening and closing the third electrical line and the fourth electrical line comprises a second switch of the switch assembly for opening and closing the fourth electrical line.

Another advantage resides in providing an MRI system, wherein the first electrical line or the second electrical line comprises a third switch of the switch assembly for connecting or disconnecting the gradient coil by opening or closing the first electrical respectively the second electrical line. In general, the first switch and the second switch could be used for galvanically decoupling the superconducting field coil for persistence mode. However, preferably the second electrical line comprises a third switch of the switch assembly for opening and closing the second electrical line.

According to a preferred embodiment of the invention, the superconducting field coil of the MRI system is connected to the third electrical line by a first contactor and to the fourth electrical line by a second contactor. The contactors may be opened for the superconducting field coil running in persistent mode and closed for energizing or discharging the superconducting field coil. The contactors may be part of a contactor assembly for providing a closed-loop operation of the superconducting field coil.

Further, according to a preferred embodiment of the invention, the MRI system comprises a diode array which is adapted for parallel circuit to the fourth electrical line and a fourth switch of the switch assembly for connecting or disconnecting the diode array to the fourth electrical line. The diode array may be adapted for being connected during discharging the superconducting field coil at low current values to drive the current in the superconducting field coil to zero in a limited amount of time or may be adapted for being connected during the entire discharging process. The diode array may also be implemented parallel to another electrical line that connects the superconducting field coil with the gradient axis, for example to the third electrical line.

The superconducting field coil may also be quenched at low currents, for example for 20% of full current, to speed up the discharge process. In this case, a diode array is not required. Quenching may be especially an opportunity for sealed magnets, where helium is not evaporated by this quench.

According to a preferred embodiment of the invention, the MRI system further comprises a plurality of gradient systems, wherein each of the gradient systems includes a gradient coil for generating gradient magnetic fields and a gradient amplifier which is connectable to the gradient coil for driving the gradient coil. Additionally, each of the gradient systems comprises a switch assembly which is adapted for galvanically coupling the superconducting field coil to each of the plurality of gradient amplifiers and to each of the plurality of gradient coils. If the term plurality of gradient systems is used, this means that two or more gradient axes may operate in parallel. Every described embodiment may be provided in combination with a plurality of gradient axes. One or more parallel gradient amplifiers may be required when the current that can be delivered by one gradient amplifier axis is not sufficient to power the magnet to full current. One gradient amplifier may deliver only 250 A, while the magnet may require 500 A to full current. In that case two gradient amplifier axes may be sufficient.

Preferably, the plurality of gradient coils and the plurality of gradient amplifiers each have a first connector and a second connector for galvanic connections to the superconducting field coil, the plurality of gradient coils and the plurality of gradient amplifiers, respectively. The first connector of a second gradient amplifier is connected to the first connector of a second gradient coil via a fifth electrical line and the second connector of the second gradient amplifier is connected to the second connector of the second gradient coil via a sixth electrical line. The third electrical line is connected with the fifth electrical line via a seventh electrical line and the fourth electrical line is connected with the sixth electrical line via an eighth electrical line. The fifth electrical line comprises a fifth switch of the switch assembly for opening and closing the fifth electrical line and the seventh electrical line comprises a sixth switch of the switch assembly for opening and closing the seventh electrical line and the eighth electrical line comprises a seventh switch of the switch assembly for opening and closing the eighth electrical line. Further embodiments are possible, i.e. combinations of several parallel gradient axes with and without diode arrays.

Further, according to the invention, a method for operating a MRI system is provided, wherein the MRI system comprises a superconducting magnet assembly with a superconducting field coil for generating a stationary uniform main magnetic field, and a gradient system including a gradient coil for generating gradient magnetic fields and a gradient amplifier which is connectable to the gradient coil for driving the gradient coil, wherein the method comprises the following method step:

galvanically coupling the superconducting field coil to the gradient amplifier for energizing or discharging the superconducting field coil, respectively.

According to a preferred embodiment of the invention, the method comprises the method step of galvanically coupling the superconducting field coil simultaneously to the gradient amplifier and to the gradient coil for discharging the superconducting field coil. For discharging the superconducting field coil the first, second and third switch are closed, so that the superconducting field coil is discharged with the gradient coil. The gradient amplifier remains connected in parallel with the gradient coil, wherein the current through the amplifier is zero. For the last amount of current, the discharging occurs with the gradient amplifier. The third switch is opened, so that the gradient coil is disconnected, and the current is running through the gradient amplifier.

Further, according to a preferred embodiment of the invention, the method comprises the method step of galvanically coupling the superconducting field coil to the gradient amplifier by connecting the diode array and opening the fourth electrical line for discharging the superconducting field coil. For connecting the diode array the fourth switch is closed and the second switch is opened, so that the fourth electrical line is opened. The amplifier does not need to be active during discharging with a connected diode array, i.e. during a power outage. Energizing and discharging is also possible with a plurality of gradient axes.

Furthermore, according to the invention, a non-transitory computer-readable medium is provided which comprises instructions stored thereon, that when executed on a processor, induce a MRI system comprising a superconducting magnet assembly with a superconducting field coil for generating a stationary uniform main magnetic field, and a gradient system including a gradient coil for generating gradient magnetic fields and a gradient amplifier which is connectable to the gradient coil for driving the gradient coil to perform a method for operating the MRI system.

A non-transitory computer-readable medium may also be implemented to the stand-alone processor in the magnet control unit and the firmware that is controlling this processor.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
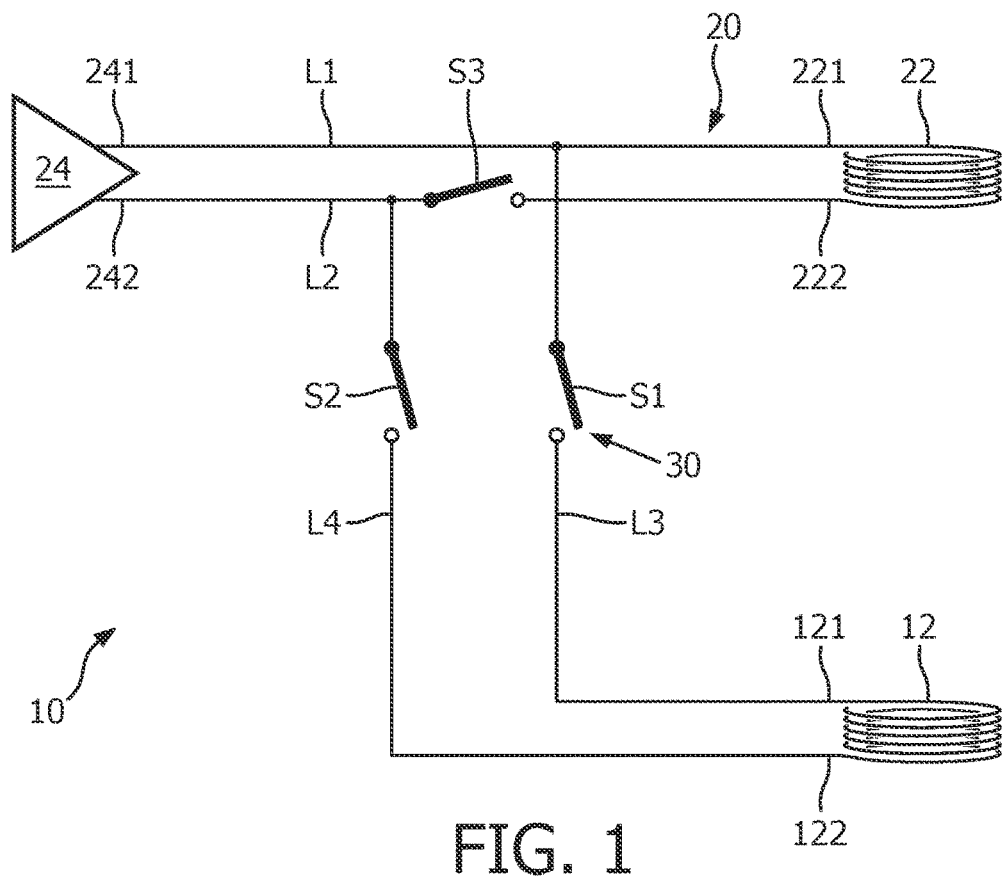
FIG. 1 schematically depicts a circuit of a magnetic resonance imaging (MRI) system according to a preferred embodiment of the invention, including a superconducting magnet assembly, a gradient system and a switch assembly.

FIG. 1 schematically depicts a circuit of an MRI system according to a preferred embodiment of the invention, including a superconducting magnet assembly 10, a gradient system 20 and a switch assembly 30. The superconducting field coil 12, the gradient coil 22 and the gradient amplifier 24 each have a first connector 121, 221, 241 and a second connector 122, 222, 242 for galvanic connections to the superconducting field coil 12, the gradient coil 22 and the gradient amplifier 24, respectively.

The first connector 241 of the gradient amplifier 24 is connected to the first connector 221 of the gradient coil 22 via a first electrical line L1 and the second connector 242 of the gradient amplifier 24 is connected to the second connector 222 of the gradient coil 22 via a second electrical line L2.

The first connector 121 of the superconducting field coil 12 is connected to the first electrical line L1 via a third electrical line L3 and the second connector 122 of the superconducting field coil 12 is connected to the second electrical line L2 via a fourth electrical line L4.

The third electrical line L3 comprises a first switch S1 of the switch assembly 30 for opening and closing the third electrical line L3, and the fourth electrical line L4 comprises a second switch S2 of the switch assembly 30 for opening and closing the fourth electrical line L4.

The second electrical line L2 comprises a third switch S3 for connecting or disconnecting the gradient coil 22.

For energizing the superconducting field coil 12, the third switch S3 is opened, the first switch S1 and the second switch S2 are closed. The superconducting field coil 12 is connected to the gradient amplifier 24 that delivers the power to the superconducting field coil 12. The gradient coil 22 is disconnected.

For discharging the superconducting field coil 12 with the gradient coil 22, the first switch S1, the second switch S2 and the third switch S3 is closed. The gradient amplifier 24 remains connected in parallel with the gradient coil 22, wherein the current through the gradient amplifier 24 is zero.

For discharging the last amount of current, the gradient coil 22 is disconnected by opening the third switch S3. The current runs through the gradient amplifier 24.

Figure 2:
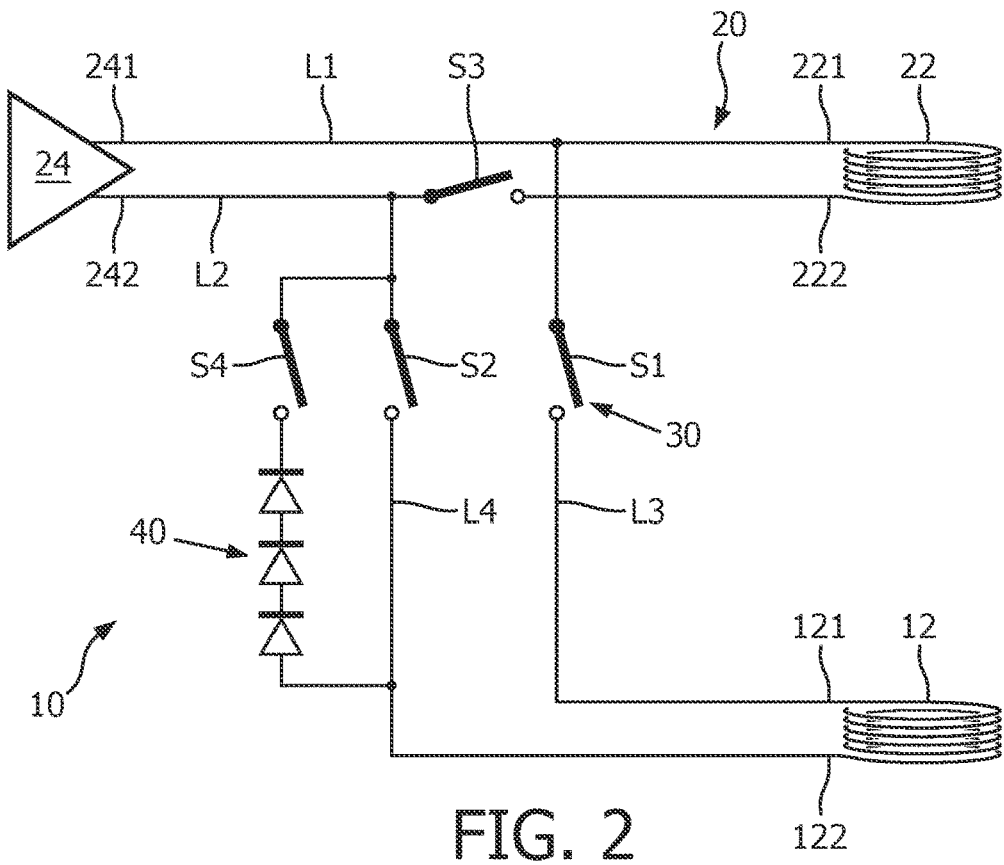
FIG. 2 schematically depicts a circuit of a magnetic resonance imaging (MRI) system according to a preferred embodiment of the invention, including a superconducting magnet assembly, a gradient system, a switch assembly and a diode array.

FIG. 2 schematically depicts a circuit of an MRI system according to a preferred embodiment of the invention, including a superconducting magnet assembly 10, a gradient system 20, a switch assembly 30 and a diode array 40.

The diode array 40 is in parallel circuit to the fourth electrical line L4 and a fourth switch S4 of the switch assembly 30 to connect or disconnect the diode array 40 to the fourth electrical line L4.

The diode array is activated if the second switch S2 is opened and the fourth switch S4 is closed, so that the fourth electrical line L4 is opened and the current runs through the diode array 40. The diode array 40 may be connected only during discharging at low current values. The diode array 40 also may be adapted to be connected during the entire discharging. In that case the diode array 40 is adapted for higher currents which requires for example an additional cooling provision of the diode array 40.

Figure 3:
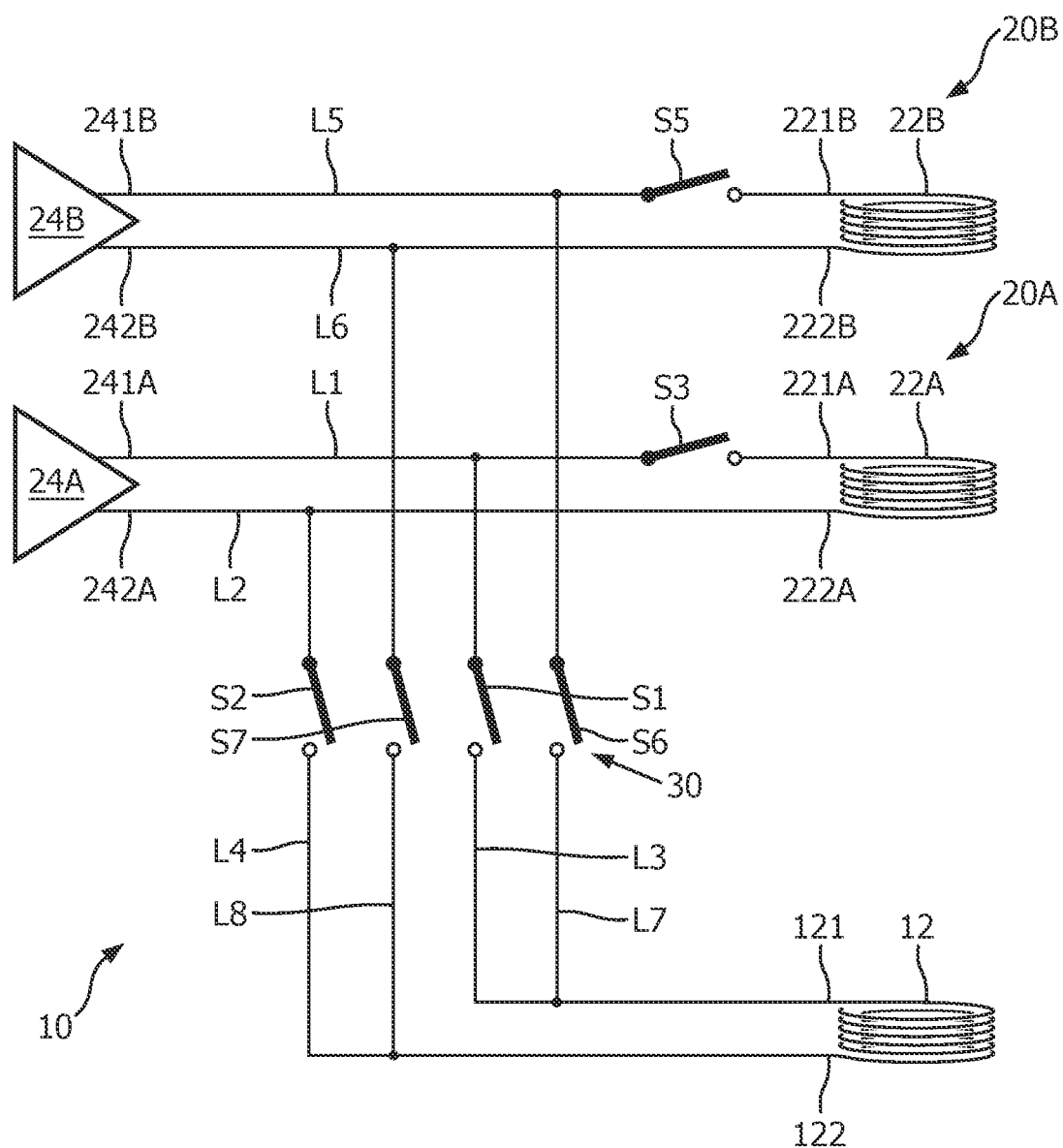
FIG. 3 schematically depicts a circuit of a magnetic resonance imaging (MRI) system according to a preferred embodiment of the invention, including a superconducting magnet assembly, a plurality of gradient systems and a switch assembly.

FIG. 3 schematically depicts a circuit of an MRI system according to a preferred embodiment of the invention, including a superconducting magnet assembly 10, a plurality of gradient systems 20A, 20B and a switch assembly 30.

The plurality of gradient coils 22A, 22B and the plurality of gradient amplifiers 24A, 24B each have a first connector 221A, 221B, 241A, 241B and a second connector 222A, 222B, 242A, 242B for galvanic connections to the superconducting field coil 12, the plurality of gradient coils 22A, 22B and the plurality of gradient amplifiers 24A, 24B, respectively.

The first connector 241B of a second gradient amplifier 24B is connected to the first connector 221B of a second gradient coil 22B via a fifth electrical line L5 and the second connector 242B of the second gradient amplifier 24B is connected to the second connector 222B of the second gradient coil 22B via a sixth electrical line L6.

The third electrical line L3 is connected with the fifth electrical line L5 via a seventh electrical line L7 and the fourth electrical line L4 is connected with the sixth electrical line L6 via an eighth electrical line L8.

The fifth electrical line L5 comprises a fifth switch S5 of the switch assembly 30 for opening and closing the fifth electrical line L5 and the seventh electrical line L7 comprises a sixth switch S6 of the switch assembly 30 for opening and closing the seventh electrical line L7, and the eighth electrical line L8 comprises a seventh switch S7 of the switch assembly 30 for opening and closing the eighth electrical line L8.

The two gradient amplifiers 24A, 24B supply a sufficient current for the superconducting field coil 12 and the two gradient coils 22A, 22B are adapted for discharging the magnet. If the current is low enough during discharging one gradient coil 22B may be disconnected, so that one gradient coil 22A remains connected to increase the discharge voltage.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST superconducting magnet assembly 10
superconducting field coil 12
first connector 121
second connector 122
gradient system 20
first gradient system 20A
second gradient system 20B
gradient coil 22
first gradient coil 22A
second gradient coil 22B
first connector 221
first connector 221A
first connector 221B
second connector 222
second connector 222A
second connector 222B
gradient amplifier 24
first gradient amplifier 24A
second gradient amplifier 24B
first connector 241
first connector 241A
first connector 241B
second connector 242
second connector 242A
second connector 242B
switch assembly 30
first switch S1
second switch S2
third switch S3
fourth switch S4
fifth switch S5
sixth switch S6
seventh switch S7
first electrical line L1
second electrical line L2
third electrical line L3
fourth electrical line L4
fifth electrical line L5
sixth electrical line L6
seventh electrical line L7
eight electrical line L8
diode array 40

What is claimed is:

1. A magnetic resonance imaging (MRI) system comprising:
    a superconducting magnet assembly with a superconducting field coil for generating a stationary uniform main magnetic field due to an electrical DC current,
    a gradient system including a gradient coil for generating gradient magnetic fields and a gradient amplifier which is connectable to the gradient coil for driving the gradient coil,
    a quench assembly to switch-off the superconducting field coil
    a switch assembly which is adapted for galvanically coupling the superconducting field coil to the gradient coil and
    a switch control configured to
    control the switch assembly to galvanically couple the superconducting field coil to the gradient coil so as to discharge the superconducting field coil resistively over the gradient coil to the threshold value of the electrical DC current strength and activate the quench assembly when the electrical DC current strength falls below the threshold value.

2. The MRI system of claim 1, wherein the switch assembly is adapted for galvanically coupling the superconducting field coil simultaneously to the gradient amplifier and to the gradient coil and the switch controller is also adapted to control the gradient amplifier so as to active the gradient amplifier to operate in reverse mode during discharge of the superconducting field coil over the gradient amplifier and/or the gradient coil.

3. The MRI system claim 1, wherein the switch assembly is adapted for galvanically decoupling the superconducting field coil for a persistent mode of the superconducting field coil.

4. The MRI system of claim 1, wherein the switch assembly is adapted for galvanically coupling the superconducting field coil to the gradient amplifier alone.

5. The MRI system of claim 1, wherein the superconducting field coil, the gradient coil and the gradient amplifier each have a first connector and a second connector for galvanic connections to the superconducting field coil, the gradient coil and the gradient amplifier, respectively,
    the first connector of the gradient amplifier is connected to the first connector of the gradient coil via a first electrical line (L1) and the second connector of the gradient amplifier is connected to the second connector of the gradient coil via a second electrical line (L2),
    the first connector of the superconducting field coil is connected to the first electrical line (L1) via a third electrical line (L3) and the second connector of the superconducting field coil is connected to the second electrical line (L2) via a fourth electrical line (L4), and the third electrical line (L3) comprises a first switch (S1) of the switch assembly (30) for opening and closing the third electrical line (L3), and the fourth electrical line (L4) comprises a second switch (S2) of the switch assembly (30) for opening and closing the fourth electrical line (L4).

6. The MRI system of claim 1, further comprising:
a diode array which is adapted for parallel circuit to the third electrical line (L3 and/or the fourth electrical line (L4), and
a fourth switch (S4) of the switch assembly for connecting or disconnecting the diode array to the fourth electrical line (L4).

7. The MRI system of claim 6, wherein the first electrical line (L1) and/or the second electrical line (L2) comprises a third switch (S3) of the switch assembly for opening and closing the second electrical line (L2).

8. The MRI system of claim 1 further comprising:
a plurality of gradient systems each including a gradient coil for generating gradient magnetic fields and a gradient amplifier which is connectable to the gradient coil for driving the gradient coil, and
a switch assembly which is adapted for galvanically coupling the superconducting field coil to each of the plurality of gradient amplifiers and to each of the plurality of gradient coils.

9. The MRI system of claim 1, wherein the plurality of gradient coils and the plurality of gradient amplifiers each have a first connector and a second connector for galvanic connections to the superconducting field coil, the plurality of gradient coils and the plurality of gradient amplifiers, respectively,
the first connector of a second gradient amplifier is connected to the first connector of a second gradient coil via a fifth electrical line (L5) and the second connector of the second gradient amplifier is connected to the second connector of the second gradient coil via a sixth electrical line (L6),
the third electrical line (L3) is connected with the fifth electrical line (L5) via a seventh electrical line (L7) and the fourth electrical line (L4) is connected with the sixth electrical line (L6) via an eighth electrical line (L8), and
the fifth electrical line (L5) comprises a fifth switch (S5) of the switch assembly (30) for opening and closing the fifth electrical line (L5), and the seventh electrical line (L7) comprises a sixth switch (S6) of the switch assembly (30) for opening and closing the seventh electrical line (L7), and the eighth electrical line (L8) comprises a seventh switch (S7) of the switch assembly for opening and closing the eighth electrical line (L8).

10. The MRI system of claim 1, wherein the threshold value is in the range between 15-30% of the superconducting field coil's nominal electrical DC current strength.

11. The MRI system of claim 1, wherein the threshold value is in the range of 22-27% of the superconducting field coil's nominal electrical DC current strength.

12. A method for operating a magnetic resonance imaging (MRI) system, the MRI system including a superconducting magnet assembly with a superconducting field coil for generating a stationary uniform main magnetic field due to an electrical DC current, a gradient system including a gradient coil for generating gradient magnetic fields, generating gradient magnetic fields and a quench assembly to switch-off the superconducting field coil, gradient coil for generating gradient magnetic fields and a quench assembly to switch-off the superconducting field coil, wherein the method comprises:
galvanically couple the superconducting field coil to the gradient coil so as to discharge the superconducting field coil resistively over the gradient coil to a threshold value of the electrical DC current strength and
active the quench assembly when the electrical DC current strength falls below the threshold value.

13. The method of claim 12, wherein the method comprises the method step of galvanically coupling the superconducting field coil simultaneously to the gradient amplifier and to the gradient coil for discharging the superconducting field coil.

14. The method of claim 12, wherein the method comprises the method step of galvanically coupling the superconducting field coil to the gradient amplifier by connecting the diode array and opening the fourth electrical line (L4) for discharging the uperconducting field coil.

15. A non-transitory computer-readable medium, comprising instructions stored thereon, that when executed on a processor or on a controller in a magnet control unit, induce a MRI system comprising a superconducting magnet assembly with a superconducting field coil for generating a stationary uniform main magnetic field, and a gradient system including a gradient coil for generating gradient magnetic fields and a gradient amplifier which is connectable to the gradient coil for driving the gradient coil to perform a method according to claim 12.

* * * * *